US011509302B2

(12) United States Patent
Hu et al.

(10) Patent No.: US 11,509,302 B2
(45) Date of Patent: Nov. 22, 2022

(54) RESET ISOLATION FOR AN EMBEDDED SAFETY ISLAND IN A SYSTEM ON A CHIP

(71) Applicant: TEXAS INSTRUMENTS INCORPORATED, Dallas, TX (US)

(72) Inventors: Chunhua Hu, Plano, TX (US); Venkateswar Reddy Kowkutla, Allen, TX (US); Charles Fuoco, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/080,239

(22) Filed: Oct. 26, 2020

(65) Prior Publication Data

US 2021/0044292 A1 Feb. 11, 2021

Related U.S. Application Data

(60) Continuation of application No. 16/299,544, filed on Mar. 12, 2019, now Pat. No. 10,819,334, which is a division of application No. 15/395,156, filed on Dec. 30, 2016, now Pat. No. 10,228,736.

(51) Int. Cl.
*H03K 17/22* (2006.01)
(52) U.S. Cl.
CPC ................... *H03K 17/22* (2013.01)

(58) Field of Classification Search
CPC ....................................... H03K 17/22
USPC ........................... 327/142, 143, 198
See application file for complete search history.

(56) References Cited

U.S. PATENT DOCUMENTS

| 6,914,461 B2 * | 7/2005 | Kwon ................. H03K 17/223 327/143 |
| 7,639,052 B2 | 12/2009 | Xiao et al. |
| 8,058,910 B1 | 11/2011 | Wright |
| 9,329,210 B1 | 5/2016 | Gupta et al. |
| 9,473,114 B1 | 10/2016 | Sandhu et al. |
| 2013/0238916 A1 | 9/2013 | Dohm et al. |
| 2016/0357696 A1 | 12/2016 | Klinglesmith et al. |

* cited by examiner

*Primary Examiner* — Joseph R Kudirka
(74) *Attorney, Agent, or Firm* — Brian D. Graham; Charles A. Brill; Frank D. Cimino

(57) ABSTRACT

Disclosed embodiments include an electronic system with a power on reset (POR) circuit. The POR circuit includes first voltage detection circuitry to perform a first detection on a supply voltage and to output a first control signal in response to the first detection, second voltage detection circuitry to perform a second detection on the supply voltage and to output a second control signal in response to the second detection, and third voltage detection circuitry to perform a third detection on the supply voltage and to output at least one third control signal in response to the third detection. The POR circuit further has sequencing circuitry with a first input to receive the at least one third control signal and to output a reset signal in response to the at least one third control signal.

20 Claims, 3 Drawing Sheets

RESET ISOLATION FOR AN EMBEDDED SAFETY ISLAND IN A SYSTEM ON A CHIP

CROSS-REFERENCE TO RELATED APPLICATION

This application is a continuation of U.S. patent application Ser. No. 16/299,544, filed on Mar. 12, 2019, which is a division of U.S. patent application Ser. No. 15/395,156, filed on Dec. 30, 2016, now U.S. Pat. No. 10,228,736, each of which is incorporated herein by reference in its entirety.

TECHNICAL FIELD

The technical field of this invention is reset signal generation.

BACKGROUND

A functional safety system often requires implementing voltage detectors and supervisory functions for a complex System on a Chip (SoC) in a larger system. Implementing those functions outside of the SoC not only increases the overall system cost, it also lacks the critical features to achieve high level functional safety standard specified by ISO 2626 and IEC 61508.

SUMMARY

In order to design a complex SoC to achieve out of context functional safety features, embedded circuitry is required to generate an internal system reset with built in redundancy. Furthermore, the SoC also needs to comprehend the impact of external reset signals to make sure the device can enter a safe state when a fault occurs.

A fully integrated method is shown for generating a power on Reset on an SoC. Continuous voltage monitoring with integrated supervisory functions and reset sequencing is implemented, with redundant, multi stage voltage monitoring.

In order to optimize the system cost of implementing functional safety, a safety island is integrated inside a System on Chip (SoC) which contains a safety processor and safety related peripherals. During run time, the non-safety island portion of the SoC may go through reset, while the safety island is required to continue running safety functions. If the safety island has pending requests to the rest of the SoC when the reset happens, those pending transactions may be lost, leading to a safety island hang. This invention provides a hardware mechanism to prevent the safety island getting into hang condition in the above scenario.

BRIEF DESCRIPTION OF THE DRAWINGS

These and other aspects of this invention are illustrated in the drawings, in which.

DETAILED DESCRIPTION

Figure 1:
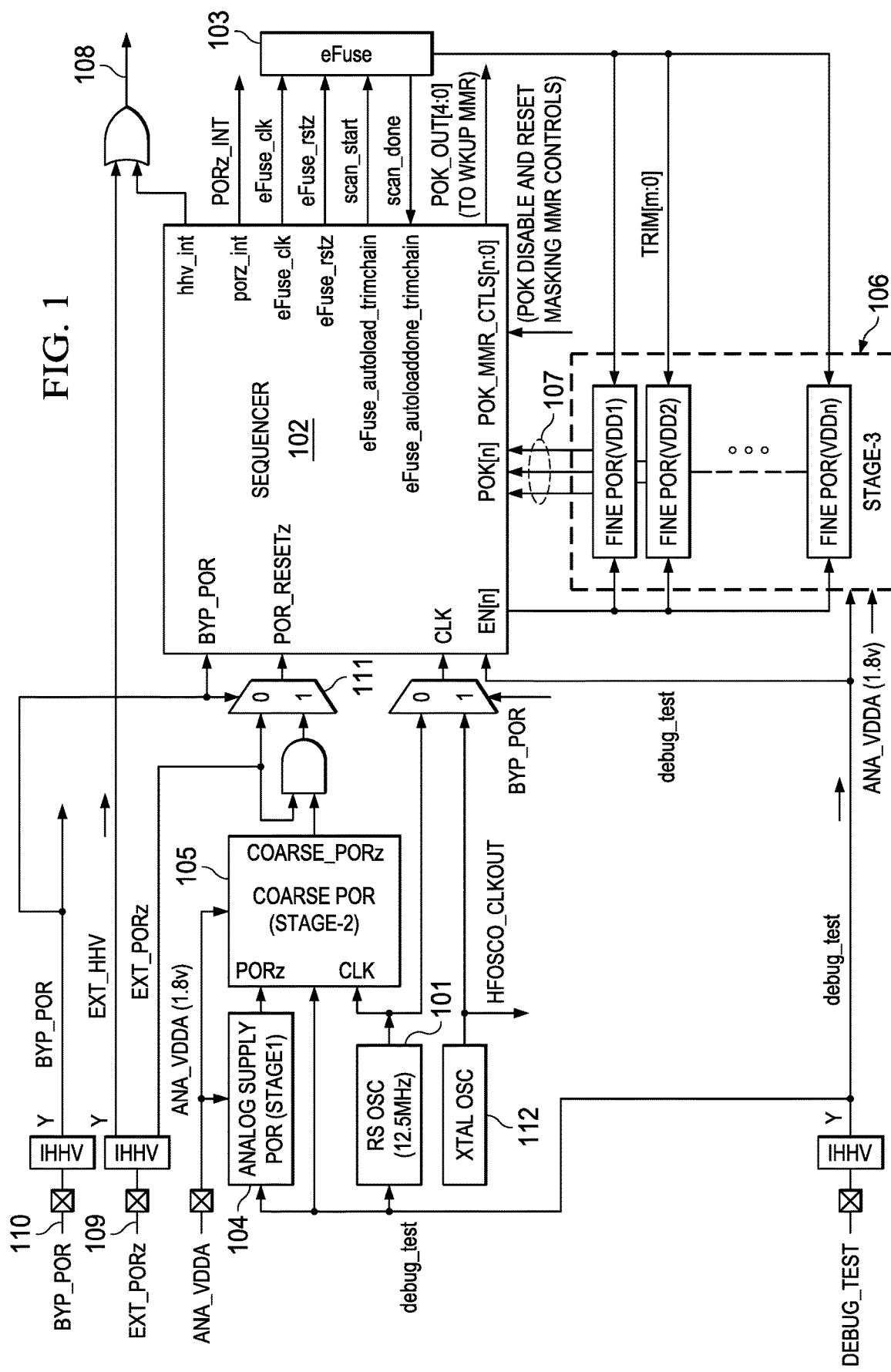
FIG. 1 shows a high level diagram of the reset circuit.

A fully integrated power on reset generation circuitry which can provide continuous voltage monitoring and reset sequencing is shown in FIG. 1. It incorporates control features such as redundancy and diagnostic capabilities which are critical to implement the functional safety feature.

The apparatus includes internal oscillators, a plurality of voltage detection stages and a power on reset (PoR) sequencer.

The internal RC oscillator 101 and crystal oscillator 112 are used to generate the clocks required by the power on reset (PoR) sequencer 102 and efuse module 103. The outputs of voltage monitors 104, 105 and 106 are passed through deglitching circuits to filter out false signals such as glitches and noise from the analog sensors.

The first stage voltage detection circuit 104 is an analog power supply level detector—this is to ensure that the voltage has reached a threshold level at which analog circuits can safely and reliably operate. The second stage voltage detection circuit 105 is a coarse level detector on analog voltage rails and some critical digital voltage rails, which are required for fine tuning analog sensors for process and temperature variations. The third stage voltage detection circuit 106 is a plurality of more accurate level detectors, which ensures that all voltage rails are operating within specified limits. The circuits implemented in the first and second stages do not require any trim values to fine tune the analog circuits for process and temperature variation compensations. The first stage voltage detection circuit 104 controls the reset to the second stage voltage detection circuit 105, and second stage controls the reset to the third stage voltage detection circuit 106. Final master reset signal 108 to the SoC will be a combined version of resets from all 3 stages. This ensures that the device will always receive a reset even if one of the stages is defective therefore providing the required redundancy needed for safety critical applications.

Once the voltage levels are valid, the second stage voltage detection circuit 105 releases reset to only a small portion of the device which enables the device to initiate the efuse scanning. The efuse block 103 contain analog trim values for the voltage detection circuits implemented in the third stage voltage detection circuit 106 for accurate voltage level monitoring. The third stage holds the reset to the designated voltage domains until it detects proper voltage levels on the rails.

After the efuse scanning in efuse block 103 is complete, the power on reset (PoR) sequencer 102 applies the trim values read out from the efuse block 103 to the analog circuits for the voltage monitors in the third stage voltage detection circuit 106. The sequencer then enables the voltage monitors for accurate detection of voltage levels on the rails. The sequencer then waits for a power OK (POK) signal 107 response from each individual detector circuit. When all the voltage monitors indicate power OK on the rails, power on reset sequencer 102 waits for all IOs and clock oscillators in the device to stabilize and then de-asserts the reset signal 108 to the designated voltage domain.

Provision is made for external reset signals 109 and 110 that will override the internally generated resets when selected by selector 111.

All reset signals are properly level shifted to the destination voltage level with appropriate pull-up or pull-down functions. This is to ensure that if the source voltage dies, the reset signal is still at an appropriate level to put the destination voltage domain in the reset state.

Figure 2:
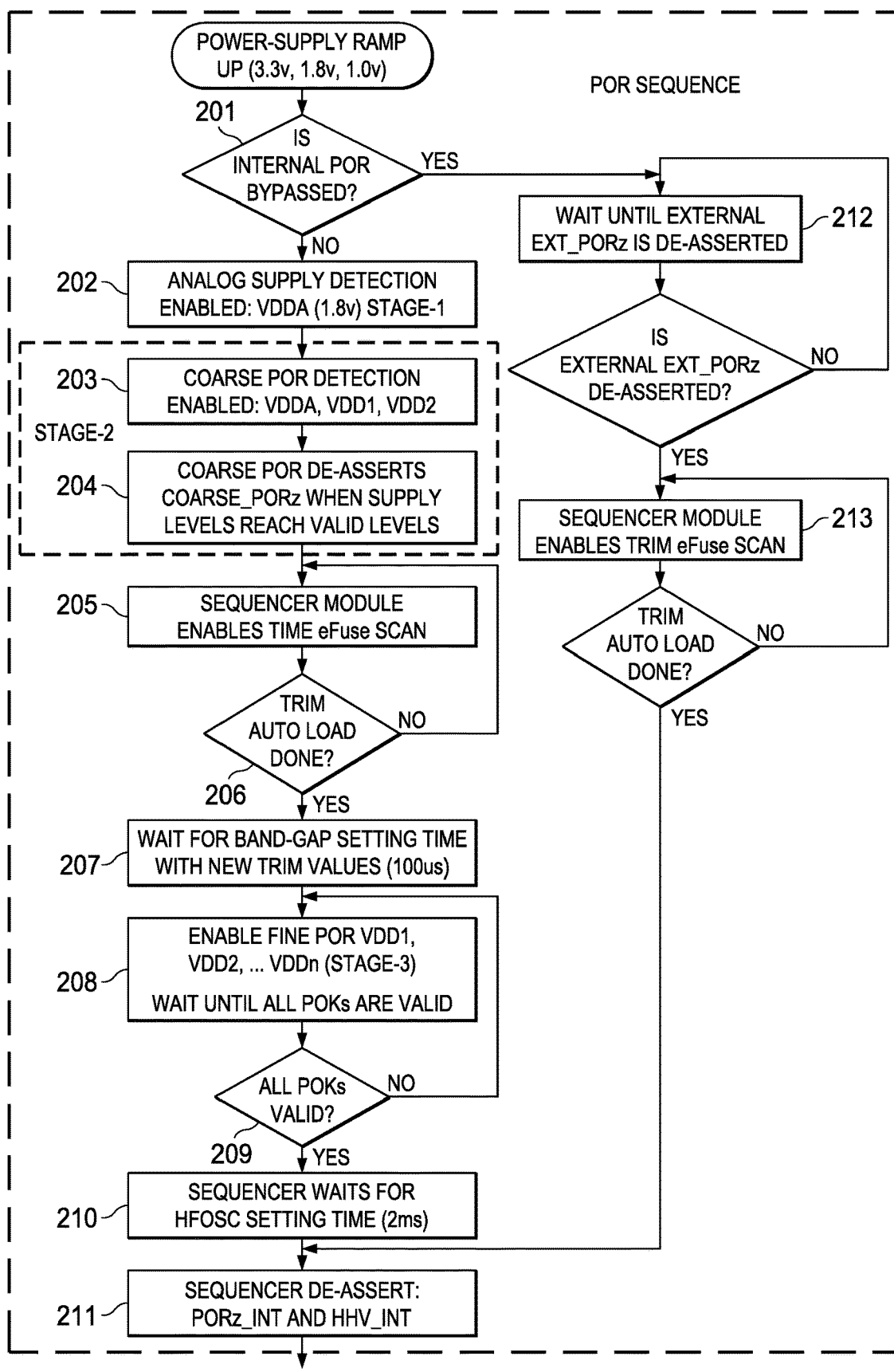
FIG. 2 is a flow chart of the reset function.

FIG. 2 shows the steps involved in the reset generation. Block 201 determines if the external PoR is asserted. If not, analog power supply detection is enabled in block 202, followed by coarse PoR detection in block 203. When power supply voltage levels reach valid levels, coarse PoR is deasserted in block 204. The sequencer module 102 now enables the trim efuse scan in block 205. When completion of the scan is determined in block 206, a settling time is introduced in block 207. After the settling time, the fine corrected power on reset signals are enabled in block 208. When all POK (Power OK) signals are valid as determined in block 209, an oscillator settling time is introduced in block 210, followed by the deassertion of the PoR signals.

If an external power on reset signal is detected in block 201, block 212 introduces a wait until the external power on reset signal is deasserted. Once that is detected, the trim efuse scan is enabled in block 213. Once trim auto load is completed, flow returns to block 211.

Figure 3:
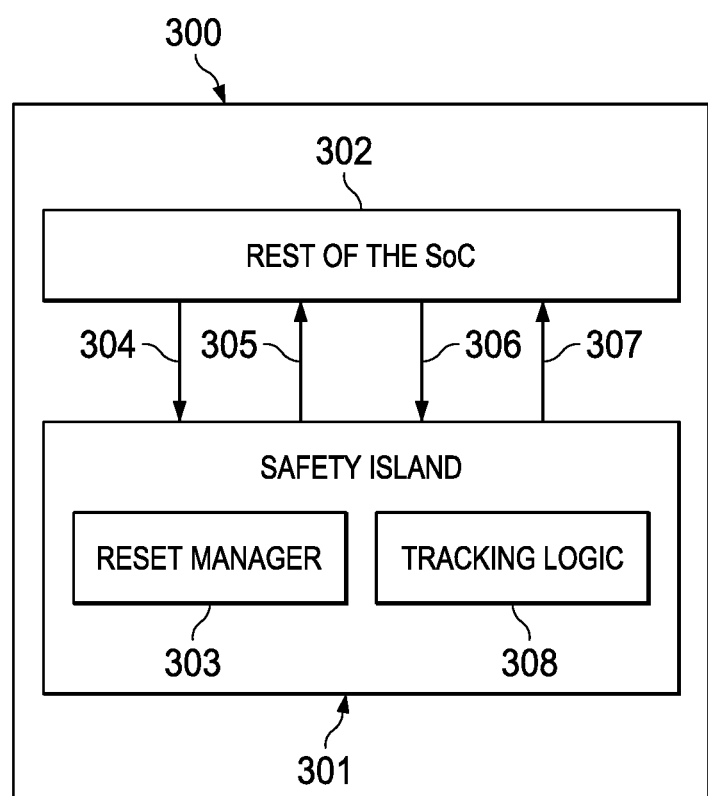
FIG. 3 shows a block diagram of the described parts of the invention.

As shown in FIG. 3, the SoC 300 is partitioned into two parts: safety island 301 and the rest of the SoC 302 including all the logic outside of the safety island. Two dedicated local reset control signals are added, 305 for controlling all the transactions from the safety island 301 to the rest of the SoC 302, and the other reset control signal 304 for all the transactions from the opposite direction. When the rest of the SoC 302 needs to go through reset, it generates a reset request signal, which is routed by 304 to the reset manager 303 inside the safety island 301 as an interrupt. Upon receiving this interrupt, the reset manager 303 will start the reset isolation sequence by asserting the two dedicated local reset control signals 304 and 305.

After these two local reset control signals are asserted, all the new transactions arriving at the boundary between safety island 301 and the rest of the SoC 302 are properly terminated to avoid system hang. Both the safety island 301 and the rest of the SoC 302 continue processing all the transactions internally and send either status or data return back to the initiator. There are bridges 306 and 307 between the safety island 301 and the rest of the SoC 302 which have tracking logic 308 to track the number of pending transactions which have been sent between safety island 301 and the rest of the SoC 302, one bridge for each direction.

When status or data for the previous pending transaction is returned from the safety island 301 to the rest of the system on a chip 302 side or from the rest of system on a chip 302 side to the safety island 301, the tracking logic 308 reduces the number of pending transactions by one for that direction. When the pending transaction count reaches zero, the bridge sends out an ack signal on 304 or 305.

The ack signals from both bridges are AND gated together by reset manager 303 as an indication that there are no more pending transactions between safety island 301 and the rest of system on a chip 302. At this point, the safety island 301 and the rest of the system on a chip 302 are isolated from each other, and the rest of the system on a chip 302 can go through reset without impacting the operation inside safety island 301.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A circuit comprising:
a plurality of stages coupled to provide a reset signal, wherein the plurality of stages includes:
a first stage that includes:
an input configured to couple to a power supply to receive a voltage signal; and
an output configured to provide a first control signal in response to the voltage signal being at least a first threshold value; and
a second stage that includes:
a first input coupled to the output of the first stage to receive the first control signal;
a second input configured to couple to the power supply to receive the voltage signal; and
an output configured to provide a second control signal in response to the first control signal and the voltage signal;
wherein the second stage is configured to:
perform a comparison between the voltage signal and a second threshold in response to the first control signal; and
provide the second control signal in response to the comparison between the voltage signal and the second threshold.

2. The circuit of claim 1, wherein:
the second stage is configured to perform the comparison of the voltage signal at a first granularity; and
the plurality of stages includes a third stage configured to perform a comparison of the voltage signal at a second granularity that is greater than the first granularity.

3. The circuit of claim 1, wherein:
the voltage signal is a first voltage signal; and
the second stage is configured to:
perform comparisons on a set of voltage signals that includes the first voltage signal; and
provide the second control signal based on the comparisons performed on the set of voltage signals.

4. The circuit of claim 3, wherein the set of voltage signals includes at least one of: a 3.3 volt signal, a 1.8 volt signal, or a 1.0 volt signal.

5. The circuit of claim 3, wherein the first control signal is not based on a second voltage signal of the set of voltage signals.

6. The circuit of claim 1 wherein the plurality of stages includes:
a third stage; and
a sequencer coupled to the second stage and to the third stage and configured to couple to a storage element, wherein the sequencer is configured to:
in response to the second control signal, read a set of trim values from the storage element;
provide the set of trim values to the third stage; and receive a third control signal from the third stage based on the set of trim values.

7. The circuit of claim 6, wherein the storage element includes an efuse.

8. The circuit of claim 6, wherein the third stage includes:
a first input coupled to the sequencer to receive the set of trim values;
a second input configured to couple to the power supply to receive the voltage signal; and
an output configured to provide the third control signal.

9. The circuit of claim 6, wherein the sequencer is configured to provide the reset signal in response to the third control signal.

10. The circuit of claim 6, wherein the third stage includes a plurality of comparators each configured to:
compare a respective voltage signal of a set of voltage signals based on a respective subset of the set of trim values; and
provide a respective power okay signal in response to the comparison of the respective voltage signal.

11. The circuit of claim 10, wherein the sequencer is configured to provide the reset signal in response to each of the power okay signals.

12. The circuit of claim 1 further comprising a safety island that includes the plurality of stages.

13. A method comprising:
receiving a voltage signal;
performing a first comparison of the voltage signal;
providing a first control signal based on the first comparison of the voltage signal;
in response to the first control signal, performing a second comparison of the voltage signal;
providing a second control signal based on the second comparison of the voltage signal; and
in response to the second control signal, providing a reset signal.

14. The method of claim 13 further comprising:
in response to the second control signal, performing a third comparison of the voltage signal at a greater granularity of than the second comparison; and
providing a third control signal based on the third comparison of the voltage signal, wherein the providing of the reset signal is further in response to the third control signal.

15. The method of claim 13 further comprising, in response to the first control signal, performing a set of comparisons of a set of voltage signals that includes the second comparison, wherein the providing of the second control signal is further in response to the set of comparisons.

16. The method of claim 15, wherein the set of voltage signals includes at least one of: a 3.3 volt signal, a 1.8 volt signal, or a 1.0 volt signal.

17. The method of claim 13 further comprising:
receiving a set of trim values;
performing a third comparison of the voltage signal using the set of trim values; and
providing a third control signal based on the third comparison of the voltage signal, wherein the providing of the reset signal is further in response to the third control signal.

18. The method of claim 17, wherein the receiving of the set of trim values includes reading the set of trim values in response to the second control signal.

19. The method of claim 17 further comprising:
performing a set of comparisons of a set of voltage signals that includes the third comparison using the set of trim values, wherein the providing of the reset signal is further in response to each comparison of the set of comparisons.

20. A circuit comprising:
an input configured to receive a voltage signal;
a first stage circuit that includes:
an input coupled to the input of the circuit to receive the voltage signal; and
an output configured to provide a first control signal, wherein the first stage circuit is configured to:
compare the voltage signal to a first threshold; and
provide the first control signal based on whether the voltage signal reaches the first threshold;
a second stage circuit that includes:
a first input coupled to the output of the first stage circuit to receive the first control signal;
a second input coupled to the input of the circuit to receive the voltage signal; and
an output configured to provide a second control signal, wherein the second stage circuit is configured to, based on the first control signal:
compare the voltage signal to a second threshold; and
provide the second control signal based on whether the voltage signal reaches the second threshold; and
a sequencer circuit that includes:
an input coupled to the output of the second stage circuit to receive the second control signal; and
an output configured to provide a reset signal based on the second control signal.

* * * * *